United States Patent
Yang et al.

(10) Patent No.: US 11,355,625 B2
(45) Date of Patent: Jun. 7, 2022

(54) DEVICE AND SEMICONDUCTOR STRUCTURE FOR IMPROVING THE DISADVANTAGES OF P-GAN GATE HIGH ELECTRON MOBILITY TRANSISTOR

(71) Applicants: Delta Electronics, Inc., Taoyuan (TW); NATIONAL CENTRAL UNIVERSITY, Jhongli (TW)

(72) Inventors: Chun-Chieh Yang, Taoyuan (TW); Yue-Ming Hsin, Jhongli (TW); Yi-Nan Zhong, Jhongli (TW); Yu-Chen Lai, Jhongli (TW)

(73) Assignees: DELTA ELECTRONICS, INC., Taoyuan (TW); NATIONAL CENTRAL UNIVERSITY, Jhongli (TW)

( * ) Notice: Subject to any disclaimer, the term of this patent is extended or adjusted under 35 U.S.C. 154(b) by 0 days.

(21) Appl. No.: 16/937,298

(22) Filed: Jul. 23, 2020

(65) Prior Publication Data
US 2022/0029008 A1  Jan. 27, 2022

(51) Int. Cl.
*H01L 27/088*    (2006.01)
*H01L 29/20*     (2006.01)
*H01L 29/778*    (2006.01)
*H01L 29/205*    (2006.01)

(52) U.S. Cl.
CPC ........ *H01L 29/7786* (2013.01); *H01L 27/088* (2013.01); *H01L 29/205* (2013.01)

(58) Field of Classification Search
CPC ........................... H01L 29/205; H01L 27/088
See application file for complete search history.

(56) References Cited

U.S. PATENT DOCUMENTS

| | | | |
|---|---|---|---|
| 9,087,718 B2 * | 7/2015 | Lal | H01L 29/7787 |
| 9,660,048 B2 | 5/2017 | Hwang et al. | |
| 2013/0020614 A1 * | 1/2013 | Lu | H01L 29/42316 257/194 |
| 2015/0001624 A1 | 1/2015 | Weis | |
| 2016/0293601 A1 | 10/2016 | Majhi et al. | |
| 2018/0350944 A1 * | 12/2018 | Huang | H01L 21/8252 |

* cited by examiner

*Primary Examiner* — Fernando L Toledo
*Assistant Examiner* — Valerie N Newton
(74) *Attorney, Agent, or Firm* — Muncy, Geissler, Olds & Lowe, PC

(57) ABSTRACT

A device includes a first transistor and a second transistor. The first transistor includes a first gate terminal coupled to the first source terminal, a first source terminal, and a first drain terminal. The second transistor includes a second gate terminal coupled to the first drain terminal, a second source terminal, and a second drain terminal.

20 Claims, 2 Drawing Sheets

DEVICE AND SEMICONDUCTOR STRUCTURE FOR IMPROVING THE DISADVANTAGES OF P-GAN GATE HIGH ELECTRON MOBILITY TRANSISTOR

BACKGROUND OF THE INVENTION

Field of the Invention

The disclosure relates generally to a device and a semiconductor structure for improving the disadvantages of p-GaN gate high electron mobility transistors (HEMT).

Description of the Related Art

In recent years, the development of semiconductor devices for use in computers, consumer electronics, and other fields has progressed rapidly. Currently, semiconductor device technology has been widely accepted in Metal-Oxide-Semiconductor Field-Effect Transistor (MOSFET) products that are marketed with a high market share.

The natural form of GaN-based devices is a normally-on or a depletion mode (d-mode) device. These types of devices can be used in power semiconductor systems by means of special drivers or in a cascode package solution, yet the market demand is high for normally-off or enhancement mode (e-mode) devices, such as p-GaN HEMT.

However, P-GaN gate e-mode HEMT still face some challenges. First, the threshold of a P-GaN gate e-mode HEMT is too low to prevent the switches from faulty turned on by EMI, noise, or voltage perturbation. Second, P-GaN gate e-mode HEMT has significant gate leakage current, which may vary from process to process. Third, gate reliability of the P-GaN gate e-mode HEMT is influenced by doping so that the P-GaN gate e-mode HEMT cannot sustain high voltages.

BRIEF SUMMARY OF THE INVENTION

Devices and semiconductor structures of a proposed e-mode HEMT are provided herein. The proposed e-mode HEMT is implemented by an ordinary HEMT process without any additional mask. In addition, the threshold voltage, the gate leakage current, the reverse conduction loss, the input capacitance from the gate terminal, the dynamic turn-on resistance, the breakdown voltage, and gate reliability of the new e-mode HEMT have been also improved. In addition, the turn-on resistance of the proposed e-mode HEMT is almost identical to that of an ordinary HEMT since the channel of the proposed e-mode HEMT is identical to that of an ordinary HEMT.

In an embodiment, a device comprises a first transistor and a second transistor. The first transistor comprises a first gate terminal, a first source terminal, and a first drain terminal, in which the first gate terminal is coupled to the first source terminal. The second transistor comprises a second gate terminal, a second source terminal, and a second drain terminal, in which the second gate terminal is coupled to the first drain terminal.

According to an embodiment of the invention, each of the first transistor and the second transistor is an E-mode HEMT.

According to an embodiment of the invention, each of the first transistor and the second transistor is a p-GaN gate HEMT.

According to an embodiment of the invention, the device is an E-mode HEMT formed by the first transistor and the second transistor.

According to an embodiment of the invention, the E-mode HEMT comprises a gate terminal, a source terminal, and a drain terminal, in which the gate terminal is formed by the first gate terminal, the source terminal is formed by the second source terminal, and the drain terminal is formed by the second drain terminal.

According to an embodiment of the invention, the first gate terminal is spaced apart from the first drain terminal by a first length, wherein a gate leakage of the E-mode HEMT is determined according to the first length.

According to an embodiment of the invention, the second gate terminal is spaced apart from the second drain terminal by a second length. A breakdown voltage between the drain terminal and the source terminal of the E-mode HEMT is determined according to the first length and the second length.

According to an embodiment of the invention, a threshold voltage of the E-mode HEMT exceeds a threshold voltage of the second transistor.

According to an embodiment of the invention, an input capacitance from the gate terminal of the E-mode HEMT is less than an input capacitance from the second gate terminal.

According to an embodiment of the invention, the first gate terminal is spaced apart from the first source terminal by a third length, and the first length exceeds the third length. The second gate terminal is spaced apart from the second source terminal by a fourth length, and the second length exceeds the fourth length.

In an embodiment, a semiconductor structure, comprises a substrate, a III-V compound buffer layer, a first III-V compound layer, a second III-V compound layer, a first gate structure, a second gate structure, a first source region, a first drain region, a second source region, and a second drain region. The III-V compound buffer layer is disposed over the substrate. The top of the III-V compound buffer layer comprises a first region and a second region. The first III-V compound layer is disposed in the first region and over the III-V compound buffer layer. The second III-V compound layer is disposed in the second region and over the III-V compound buffer layer. The first gate structure is disposed over the first III-V compound layer. The second gate structure is disposed over the second III-V compound layer. The first source region is coupled to the first gate structure. The first drain region is coupled to the second gate structure. The first source region and the first drain region are respectively disposed on two opposite sides of the first gate structure and over the first III-V compound layer. The second source region and the second drain region are respectively disposed on two opposite sides of the second gate structure and over the second III-V compound layer.

According to an embodiment of the invention, the first gate structure further comprises a first P-type III-V compound layer and a first gate electrode. The first P-type III-V compound layer is disposed over the first III-V compound layer. The first gate electrode is disposed over the first P-type III-V compound layer.

According to an embodiment of the invention, the second gate structure further comprises a second P-type III-V compound layer and a second gate electrode. The second P-type III-V compound layer is disposed over the second III-V compound layer. The second gate electrode is disposed over the second P-type III-V compound layer.

According to an embodiment of the invention, a first e-mode HEMT and a second e-mode HEMT are formed in the first region and the second region respectively.

According to an embodiment of the invention, the semiconductor structure forms an e-mode HEMT comprising a gate terminal, a source terminal, and a drain terminal, in which the gate terminal is formed by the first gate structure, the source terminal is formed by the second source region, and the drain terminal is formed by the second drain region.

According to an embodiment of the invention, the first gate structure is spaced apart from the first drain region by a first length. A gate leakage of the E-mode HEMT is determined according to the first length.

According to an embodiment of the invention, the second gate structure is spaced apart from the second drain region by a second length. A breakdown voltage between the drain terminal and the source terminal of the e-mode HEMT is determined according to the first length and the second length.

According to an embodiment of the invention, a threshold voltage of the E-mode HEMT exceeds a threshold voltage of a transistor formed in the second region.

According to an embodiment of the invention, an input capacitance from the gate terminal is less than an input capacitance from the second gate structure.

According to an embodiment of the invention, the first gate structure is spaced apart from the first source region by a third length, and the first length exceeds the third length, wherein the second gate terminal is spaced apart from the second source terminal by a fourth length, and the second length exceeds the fourth length.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
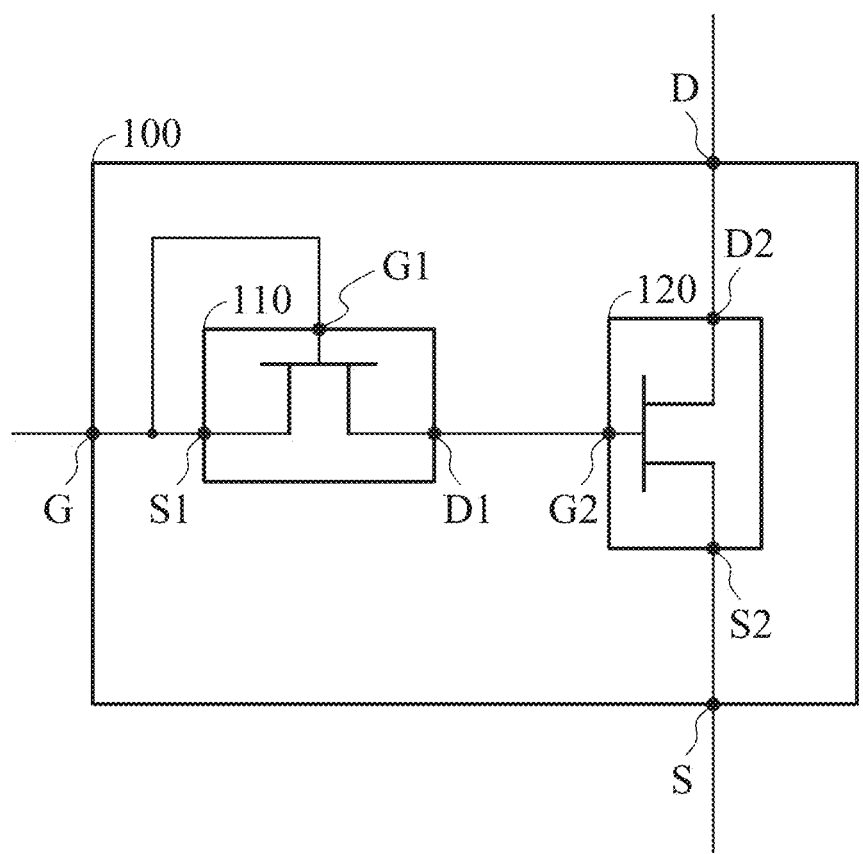
FIG. 1 is a schematic diagram of a device in accordance with an embodiment of the invention.

The semiconductor device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should also be noted that the present disclosure presents embodiments of a semiconductor device, and may be included in an integrated circuit (IC) such as a microprocessor, memory device, and/or another device. The IC may also include various passive and active microelectronic devices, such as thin film resistors, another capacitor (e.g. metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, and other types of transistors. One of ordinary skill may recognize that the high-voltage semiconductor devices may be used in other type of semiconductor elements.

FIG. 1 is a schematic diagram of a device in accordance with an embodiment of the invention. As shown in FIG. 1, the device 100 includes a first transistor 110 and a second transistor 120. According to an embodiment of the invention, each of the first transistor 110 and the second transistor 120 is an e-mode HEMT and implemented in the same process without any additional mask. According to another embodiment of the invention, each of the first transistor 110 and the second transistor 120 is a p-GaN gate transistor. According to an embodiment of the invention, the device 100 is a new e-mode HEMT formed by the first transistor 110 and the second transistor 120.

The first transistor 110 includes a first gate terminal G1, a first source terminal S1, and a first drain terminal D1. As shown in FIG. 1, the first gate terminal G1 is coupled to the first source terminal S1 so that the first transistor 110 forms a diode-like device. The second transistor 120 includes a second gate terminal G2, a second source terminal S2, and a second drain terminal D2. As shown in FIG. 1, the second gate terminal G2 is coupled to the first drain terminal D1.

As shown in FIG. 1, the device 100 is a new transistor formed by the first transistor 110 and the second transistor 120, which includes a gate terminal G, a source terminal S, and a drain terminal D. The gate terminal G of the device 100 is formed by the first gate terminal G1 and the source terminal S1 of the first transistor 110 which are coupled to each other. The source terminal S of the device 100 is formed by the second source terminal S2 of the second transistor 120. The drain terminal D of the device 100 is formed by the second drain terminal D2 of the second transistor 120.

Figure 2:
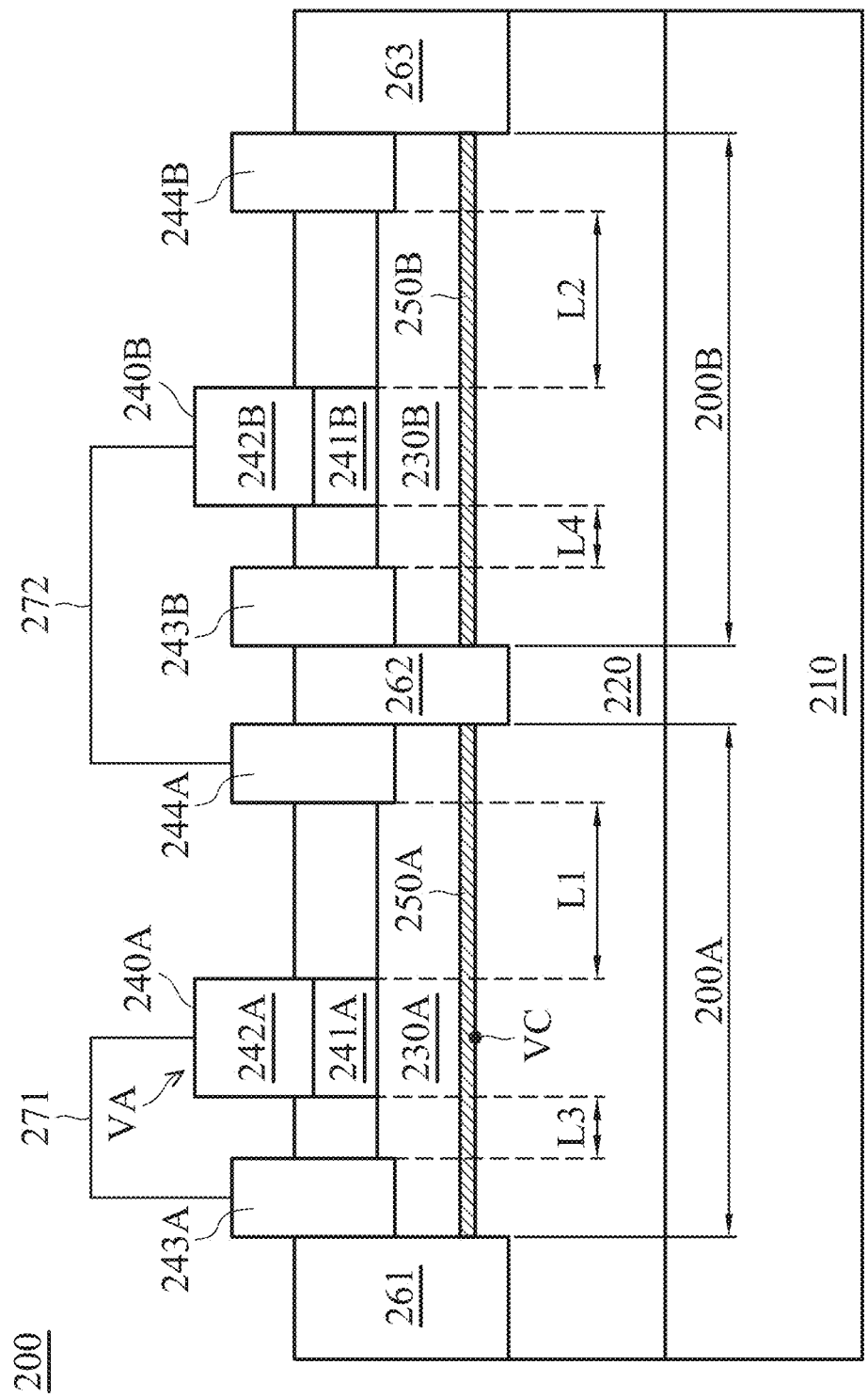
FIG. 2 is a cross-sectional view of a semiconductor structure in accordance with an embodiment of the invention.

FIG. 2 is a cross-sectional view of a semiconductor structure in accordance with an embodiment of the invention. According to an embodiment of the invention, the semiconductor structure 200 in FIG. 2 is configured to implement the device 100 in FIG. 1.

As shown in FIG. 2, the semiconductor structure 200 includes a substrate 210. The substrate 210 may include, but is not limited to, semiconductor substrate such as a silicon substrate. In addition, the substrate 210 may include an element semiconductor which may include germanium; compound semiconductor which may include silicon carbide, gallium arsenide, gallium phosphide, indium phosphide, indium arsenide and/or indium antimonide; alloy semiconductor which may include SiGe alloy, GaAsP alloy, AlInAs alloy, AlGaAs alloy, GaInAs alloy, GaInP alloy and/or GaInAsP alloy, or a combination thereof. In addition, the substrate 210 may include semiconductor-on-insulator. In addition, the substrate 210 may include an epitaxial layer (not shown). For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX), or another suitable technique such as wafer bonding and grinding.

As shown in FIG. 2, the semiconductor structure 200 also includes a III-V compound buffer layer 220, which is disposed over the substrate 210, in which the top of the III-V compound buffer layer 220 includes a first region 200A and a second region 200B. The first region 200A includes a first III-V compound layer 230A which is disposed over the III-V compound buffer layer 220. The second region 200B includes a second III-V compound layer 230B which is disposed over the III-V compound buffer layer 220.

According to some embodiments of the invention, the first III-V compound layer 230A and the III-V compound buffer layer 220 are material layers with different band gaps, and the second III-V compound layer 230B and the III-V compound buffer layer 220 are material layers with different band gaps. According to an embodiment of the invention, the first III-V compound layer 230A, the second III-V compound layer 230B, and the III-V compound buffer layer 220 are compounds made from the III-V groups in the periodic table of elements. However, the first III-V compound layer 230A (or the second III-V compound layer 230B) and the III-V compound buffer layer 220 are different from each other in composition. According to an embodiment of the invention, the III-V compound buffer layer 220 includes a gallium nitride (GaN) layer. Each of the first III-V compound layer 230A and the second III-V compound layer 230B includes an aluminum gallium nitride layer (also referred to as $Al_xGa_{1-x}N$ layer, wherein $0<x<1$) or indium aluminum nitride layer and/or others. The first III-V compound layer 230A and the III-V compound buffer layer 220 are in direct contact with each other, while the second III-V compound layer 230B and the III-V compound buffer layer 220 are in direct contact with each other. Since the first III-V compound layer 230A (or the second III-V compound layer 230B) and the III-V compound buffer layer 220 have different band gaps, a heterojunction can be formed in the interface between the first III-V compound layer 230A (or the second III-V compound layer 230B) and the III-V compound buffer layer 220 when a voltage is biased.

As shown in FIG. 2, the first region 200A also includes a first gate structure 240A, a first source region 243A and a first drain region 244A, in which the first source region 243A and the first drain region 244A are formed on two opposite sides of the first gate structure 240A and on top of the first III-V compound layer 230A. As shown in FIG. 2, the first gate structure 240A is spaced apart from the first drain region 244A by a first length L1, and spaced apart from the first source region 243A by a third length L3, in which the first length L1 exceeds the third length L3. According to an embodiment of the invention, the first gate structure 240A corresponds to the first gate terminal G1, the first source region 243A corresponds to the first source terminal S1 in FIG. 1, and the first drain region 244A corresponds to the first drain terminal D1 in FIG. 1.

As shown in FIG. 2, the first gate structure 240A is formed over the substrate 210, and over the first III-V compound layer 230A. The first gate structure 240A includes a first P-type III-V compound layer 241A and a first gate electrode layer 242A. The first P-type III-V compound layer 241A is disposed over the first III-V compound layer 230A, and the first gate electrode 242A is disposed over the first P-type III-V compound layer 241A. According to an embodiment of the invention, the first P-type III-V compound layer 241A includes a P-type gallium nitride (GaN) layer or AlGaN layer and/or others. According to an embodiment of the invention, e-mode high electron mobility transistor (HEMT) is formed in the first region 200A. According to an embodiment of the invention, when a positive voltage exceeding a threshold voltage is applied to the first gate electrode layer 242A, a first carrier channel 250A is formed at the interface between the first III-V compound layer 230A and the III-V compound buffer layer 220.

The first source region 243A and the first drain region 244A include metals selected from the group consisting of titanium, aluminum, nickel, gold, and other metals. The first source region 243A and the first drain region 244A can be formed by a process such as physical vapor deposition (PVD), chemical vapor deposition (CVD), atomic layer deposition (ALD), coating, sputtering, or another proper technique.

As shown in FIG. 2, the second region 200B also includes a second gate structure 240B, a second source region 243B and a second drain region 244B, in which the second source region 243B and the second drain region 244B are formed on two opposite sides of the second gate structure 240B and on top of the second III-V compound layer 230B. As shown in FIG. 2, the second gate structure 240B is spaced apart from the second drain region 244B by a second length L2, and spaced apart from the second source region 243B by a fourth length L4, in which the second length L2 exceeds the fourth length L4. According to an embodiment of the invention, the second gate structure 240B corresponds to the second gate terminal G2, the second source region 243B corresponds to the second source terminal S2 in FIG. 1, and the second drain region 244B corresponds to the second drain terminal D2 in FIG. 1.

As shown in FIG. 2, the second gate structure 240B is formed over the substrate 210, and over the second III-V compound layer 230B. The second gate structure 240B includes a second P-type III-V compound layer 241B and a second gate electrode layer 242B. The second P-type III-V compound layer 241B is disposed over the second III-V compound layer 230B, and the second gate electrode 242B is disposed over the second P-type III-V compound layer 241B. According to an embodiment of the invention, the second P-type III-V compound layer 241B includes a P-type gallium nitride (GaN) layer or AlGaN layer and/or others. According to an embodiment of the invention, e-mode high electron mobility transistor (HEMT) is formed in the second region 200B. According to an embodiment of the invention, when a positive voltage exceeding a threshold voltage is applied to the second gate electrode layer 242B, a second carrier channel 250B is formed at the interface between the second III-V compound layer 230B and the III-V compound buffer layer 220.

As shown in FIG. 2, the semiconductor structure 200 further includes a first isolating layer 261, a second isolating layer 262, and a third isolating layer 263. The first region 200A is formed between the first isolating layer 261 and the second isolating layer 262. The second region 200B is formed between the second isolating layer 262 and the third isolating layer 263. According to an embodiment of the invention, the first isolating layer 261, the second isolating layer 262, and the third isolating layer 263 are formed by mesa etching or ion implantation.

As shown in FIG. 2, the semiconductor structure 200 further includes a first interconnect layer 271 and a second interconnect layer 272. The first interconnect layer 271 is configured to couple the first source region 243A to the first gate electrode 242A. The second interconnect layer 272 is configured to couple the first drain region 244A to the second gate electrode 242B. Referred to FIGS. 1 and 2, the first transistor 110 is implemented in the first region 200A, and the second transistor 120 is implemented in the second region 200B. Therefore, the device 100 in FIG. 1 is implemented by the semiconductor structure 200 in FIG. 2.

Regarding the threshold voltage, the threshold voltage of the device 100 formed by the first transistor 110 and the second transistor 120 exceeds that of the first transistor 110 or the second transistor 120. Since the device 100 is turned on by turning on the first transistor 110 and the second transistor 120 which are electrically connected to each other, the threshold voltage of the device 100 should be increased.

Regarding the gate leakage current, the gate leakage current of the device 100 is lower than that of the first transistor 110 or the second transistor 120. As shown in FIG. 2, the channel voltage VC is a voltage of the first carrier channel 250A, and an applied voltage VA is applied to the first gate structure 240A.

When the first transistor 110 (corresponding to the first region 200A) is turned on, the applied voltage VA should exceed the channel voltage VC by the threshold voltage VTH, which is expressed as Eq. 1. In addition, the channel voltage VC is equal to a channel resistance RON of the first carrier channel 250A multiplied by a channel current ID flowing through the first carrier 250A, which is expressed as Eq. 2. According to an embodiment of the invention, the channel resistance is determined by the first length L1.

$$VA-VC>VTH \qquad (Eq. 1)$$

$$VC=RON \times ID \qquad (Eq. 2)$$

With the channel current ID of the first transistor 110 increasing, the channel voltage VC increases accordingly. When the difference of the applied voltage VA and the channel voltage VC does not exceed the threshold voltage VTH, the first transistor 110 is turned off and the channel current ID of the first transistor 110 is thus limited, in which the gate leakage current of the device 100 corresponds to the channel current ID of the first transistor 110. In other words, the gate leakage current of the device 100 can be properly designed by the first length L1.

Regarding the turn-on resistance, since the drain terminal D of the device 100 corresponds to the second drain terminal D2 of the second transistor 120 and the source terminal S of the device 100 corresponds to the second source terminal S2 of the second transistor 120, the turn-on resistance of the device 100 is almost identical to that of the second transistor 120.

Regarding the reverse conduction loss, when the gate-to-source voltage is negative, the drain-to-source voltage is negative, and the channel current flows from the source terminal to the drain terminal, the reverse conduction loss of the device 100 is less than that of the second transistor 120. This indicates that the source-to-drain voltage of the device 100 is less than that of the second transistor 120 when the gate-to-source voltage is negative and the channel current flows from the source terminal to the drain terminal.

Regarding the input capacitance from the gate terminal, the input capacitance from the gate terminal G of the device 100 is less than the input capacitance from the second gate terminal G2 of the second transistor 120 or the first gate terminal G1 of the first transistor 110. Since the device 100 includes two transistors electrically connected to each other, it is reasonable that the input capacitance from the gate terminal G is less.

Regarding the dynamic turn-on resistance, the dynamic turn-on resistance of the device 100 is improved, comparing with the second transistor 120. According to an embodiment of the invention, the dynamic turn-on resistance of the device 100 is improved due to the first length L1 between the first gate structure 240A and the first drain region 244A.

Regarding the breakdown voltage, the breakdown voltage between the drain terminal D and the source terminal S of the device 100 exceeds that of a single first transistor 110 or a single second transistor 120. According to an embodiment of the invention, the breakdown voltage of the device 100 can be determined according to the first length L1 between the first gate structure 240A and the first drain region 244A and the second length L2 between the second gate structure 240B and the second drain region 244B in FIG. 2.

Regarding gate reliability, gate reliability of the device 100 is higher than that of a single first transistor 110 or a single second transistor 120. According to an embodiment of the invention, the second transistor 120 may survive for N seconds when the second gate terminal G2 of the second transistor 120 is biased with 11V; the device 100 may survive for 200*N seconds when the gate terminal G of the device 100 is biased with 11V. This indicates that gate reliability of the device 100 has been improved, which will be explained as the following paragraph.

According to an embodiment of the invention, when the gate terminal G of the device 100 is biased with a high voltage, the high voltage is applied to the first gate structure 240A, the first length L1 between the first gate structure 240A and the first drain region 244A, and the second gate structure 240B in FIG. 2 so that the voltage which is actually applied to the second gate structure 240B is much lower than the high voltage. The gate reliability of the device 100 is thus improved.

Devices and semiconductor structures of a proposed e-mode HEMT are provided herein. The proposed e-mode HEMT is implemented by an ordinary HEMT process without any additional mask. In addition, the threshold voltage, the gate leakage current, the reverse conduction loss, the input capacitance from the gate terminal, the dynamic turn-on resistance, the breakdown voltage, and gate reliability of the new e-mode HEMT have been also improved. In addition, the turn-on resistance of the proposed e-mode HEMT is almost identical to that of an ordinary HEMT since the channel of the proposed e-mode HEMT is identical to that of an ordinary HEMT.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may vary while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device, comprising:
   a first transistor, comprising a first gate terminal, a first source terminal, and a first drain terminal, wherein the first gate terminal is coupled to the first source terminal; and
   a second transistor, comprising a second gate terminal, a second source terminal, and a second drain terminal, wherein the second gate terminal is coupled to the first drain terminal.

2. The device of claim 1, wherein each of the first transistor and the second transistor is an E-mode HEMT.

3. The device of claim 1, wherein each of the first transistor and the second transistor is a p-GaN gate HEMT.

4. The device of claim 1, wherein the device is an E-mode HEMT formed by the first transistor and the second transistor.

5. The device of claim 4, wherein the E-mode HEMT comprises a gate terminal, a source terminal, and a drain terminal, wherein the gate terminal is formed by the first gate terminal, the source terminal is formed by the second source terminal, and the drain terminal is formed by the second drain terminal.

6. The device of claim 5, wherein the first gate terminal is spaced apart from the first drain terminal by a first length, wherein a gate leakage of the E-mode HEMT is determined according to the first length.

7. The device of claim 5, wherein the second gate terminal is spaced apart from the second drain terminal by a second length, wherein a breakdown voltage between the drain terminal and the source terminal of the E-mode HEMT is determined according to the first length and the second length.

8. The device of claim 5, wherein a threshold voltage of the E-mode HEMT exceeds a threshold voltage of the second transistor.

9. The device of claim 5, wherein an input capacitance from the gate terminal of the E-mode HEMT is less than an input capacitance from the second gate terminal.

10. The device of claim 5, wherein the first gate terminal is spaced apart from the first source terminal by a third length, and the first length exceeds the third length, wherein the second gate terminal is spaced apart from the second source terminal by a fourth length, and the second length exceeds the fourth length.

11. A semiconductor structure, comprising:
    a substrate;
    a III-V compound buffer layer, disposed over the substrate, wherein a top of the III-V compound buffer layer comprises a first region and a second region;
    a first III-V compound layer, disposed in the first region and over the III-V compound buffer layer;
    a second III-V compound layer, disposed in the second region and over the III-V compound buffer layer;
    a first gate structure, disposed over the first III-V compound layer;
    a second gate structure, disposed over the second III-V compound layer;
    a first source region, coupled to the first gate structure;
    a first drain region, coupled to the second gate structure, wherein the first source region and the first drain region are respectively disposed on two opposite sides of the first gate structure and over the first III-V compound layer;

a second source region; and a second drain region, wherein the second source region and the second drain region are respectively disposed on two opposite sides of the second gate structure and over the second III-V compound layer.

12. The semiconductor structure of claim 11, wherein the first gate structure further comprises:

a first P-type III-V compound layer, disposed over the first III-V compound layer; and a first gate electrode, disposed over the first P-type III-V compound layer.

13. The semiconductor structure of claim 11, wherein the second gate structure further comprises:

a second P-type III-V compound layer, disposed over the second III-V compound layer; and a second gate electrode, disposed over the second P-type III-V compound layer.

14. The semiconductor structure of claim 11, wherein a first e-mode HEMT and a second e-mode HEMT are formed in the first region and the second region respectively.

15. The semiconductor structure of claim 11, wherein the semiconductor structure forms an e-mode HEMT comprising a gate terminal, a source terminal, and a drain terminal, wherein the gate terminal is formed by the first gate structure, the source terminal is formed by the second source region, and the drain terminal is formed by the second drain region.

16. The semiconductor structure of claim 15, wherein the first gate structure is spaced apart from the first drain region by a first length, wherein a gate leakage of the E-mode HEMT is determined according to the first length.

17. The semiconductor structure of claim 15, wherein the second gate structure is between the drain terminal and the source terminal of the E-mode HEMT is determined according to the first length and the second length.

18. The semiconductor structure of claim 15, wherein a threshold voltage of the E-mode HEMT exceeds a threshold voltage of a transistor formed in the second region.

19. The semiconductor structure of claim 15, wherein an input capacitance from the gate terminal is less than an input capacitance from the second gate structure.

20. The semiconductor structure of claim 15, wherein the first gate structure is spaced apart from the first source region by a third length, and the first length exceeds the third length, wherein the second gate terminal is spaced apart from the second source terminal by a fourth length, and the second length exceeds the fourth length.

* * * * *